(12) United States Patent
Ramanathan et al.

(10) Patent No.: US 7,358,201 B2
(45) Date of Patent: Apr. 15, 2008

(54) METHODS OF FORMING CHANNELS ON AN INTEGRATED CIRCUIT DIE AND DIE COOLING SYSTEMS INCLUDING SUCH CHANNELS

(75) Inventors: Shriram Ramanathan, Hillsboro, OR (US); Chin Chang Cheng, Portland, OR (US); Alan M. Myers, Menlo Park, CA (US)

(73) Assignee: Intel Corporation, Santa Clara, CA (US)

( * ) Notice: Subject to any disclaimer, the term of this patent is extended or adjusted under 35 U.S.C. 154(b) by 271 days.

(21) Appl. No.: 11/110,302

(22) Filed: Apr. 19, 2005

(65) Prior Publication Data

US 2005/0215058 A1    Sep. 29, 2005

Related U.S. Application Data

(62) Division of application No. 10/809,560, filed on Mar. 24, 2004, now Pat. No. 6,919,231.

(51) Int. Cl.
*H01L 21/00*    (2006.01)
(52) U.S. Cl. .................................... 438/800

(58) Field of Classification Search ............... 438/6, 438/210, 104, 107–114, 118, 121–123, 128–129, 438/135, 142, 145, 149, 151, 157, 176
See application file for complete search history.

(56) References Cited

U.S. PATENT DOCUMENTS

| | | | |
|---|---|---|---|
| 5,770,478 A * | 6/1998 | Iruvanti et al. | 438/122 |
| 5,998,240 A * | 12/1999 | Hamilton et al. | 438/122 |
| 6,605,525 B2 | 8/2003 | Lu et al. | |
| 6,617,201 B2 * | 9/2003 | Chye et al. | 438/125 |
| 6,930,327 B2 * | 8/2005 | Maeda et al. | 257/59 |
| 2004/0023428 A1 * | 2/2004 | Gole et al. | 438/48 |
| 2004/0043423 A1 * | 3/2004 | Bellew et al. | 435/7.1 |
| 2005/0170670 A1 * | 8/2005 | King et al. | 438/800 |

OTHER PUBLICATIONS

Youngcheol Joo, et al., Fabrication of Monolithic Microchannels For IC Chip Cooling, 1995 IEEE, pp. 362-367.

* cited by examiner

*Primary Examiner*—Michael Lebentritt
*Assistant Examiner*—Andre' Stevenson

(57) ABSTRACT

A method of forming channels on a die or other substrate. Also disclosed are liquid cooling systems including such channels.

8 Claims, 8 Drawing Sheets

METHODS OF FORMING CHANNELS ON AN INTEGRATED CIRCUIT DIE AND DIE COOLING SYSTEMS INCLUDING SUCH CHANNELS

CLAIM OF PRIORITY

This application is a divisional of U.S. patent application No. 10/809,560, filed Mar. 24, 2004, now U.S. Pat. No. 6,919,231.

FIELD OF THE INVENTION

The invention relates generally to the packaging of an integrated circuit die and, more particularly, to methods of forming channels on a die or other substrate, as well as die cooling systems including such channels.

BACKGROUND OF THE INVENTION

Illustrated in FIG. 1 is a conventional packaged integrated circuit (IC) device 100. The IC device 100 includes a die 110 that is disposed on a substrate 120, this substrate often referred to as the "package substrate." The die 110 may comprise a microprocessor, a network processor, or other processing device. Die 110 may be coupled with the substrate using, for example, a Controlled Collapse Chip Connection (or "C4") assembly technique, wherein a plurality of leads, or bond pads, on the die 110 are electrically connected to a corresponding plurality of leads, or lands, on the substrate 120 by an array of connection elements 130 (e.g., solder bumps, columns, etc.). Circuitry on the package substrate 120, in turn, routes the die leads to locations on the substrate 120 where electrical connections can be established with a next-level component (e.g., a motherboard, a computer system, a circuit board, another IC device, etc.). For example, the substrate circuitry may route all signal lines to a pin-grid array 125—or, alternatively, a ball-grid array—formed on a lower surface of the package substrate 120. The pin-grid (or ball-grid) array then electrically couples the die to the next-level component, which includes a mating array of terminals (e.g., pin sockets, bond pads, etc.).

During operation of the IC device 100, heat generated by the die 110 can damage the die if this heat is not transferred away from the die or otherwise dissipated. To remove heat from the die 110, the die 110 may ultimately be coupled with a heat sink 170 via a number of thermally conductive components, including a first thermal interface 140, a heat spreader 150, and a second thermal interface 160. The first thermal interface 140 is coupled with an upper surface of the die 110, and this thermal interface conducts heat from the die and to the heat spreader 150. Heat spreader 150 conducts heat laterally within itself to "spread" the heat laterally outwards from the die 110, and the heat spreader 150 also conducts the heat to the second thermal interface 160. The second thermal interface 160 conducts the heat to heat sink 170, which transfers the heat to the ambient environment. Heat sink 170 may include a plurality of fins 172, or other similar features providing increased surface area, to facilitate convection of heat to the surrounding air. The IC device 100 may also include a seal element 180 to seal the die 110 from the operating environment.

The heat sink 170, heat spreader 150, and first and second thermal interface devices 140, 160 collectively form a cooling system for the die 110. The power dissipation of microprocessors and other processing devices generally increases with each design generation, as the operating frequencies of these devices are ratcheted upwards. Also, the design and operating conditions for a die may lead to "hot spots" on the die where the local temperature is significantly greater than in surrounding regions on the die, and a failure to adequately extract heat from such hot spots may lead to damage and/or a degradation in performance of the die. Thus, the thermal performance of die cooling systems in future generations of IC devices will become increasingly critical, and the thermal performance required for these devices may push the limits of the conventional cooling system illustrated in FIG. 1.

DETAILED DESCRIPTION OF THE INVENTION

One possible solution to meet the heat dissipation needs of microprocessors and other processing devices is to employ a liquid cooling system—e.g., an active cooling system—rather than (or in combination with) heat sinks and other passive heat removal components. Disclosed herein are embodiments of a method for forming channels on a die, heat spreader, or other substrate, as well as embodiments of a liquid cooling system employing these channels for fluid flow.

Figure 1:
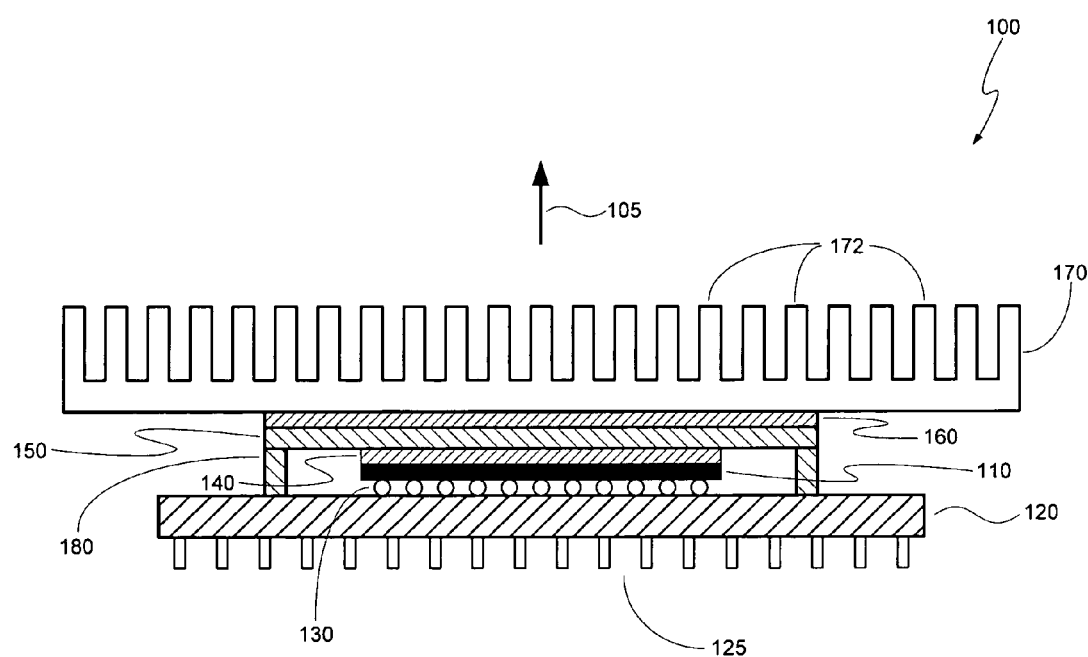
FIG. 1 is a schematic diagram illustrating a cross-sectional elevation view of a conventional integrated circuit package.
Figure 2:
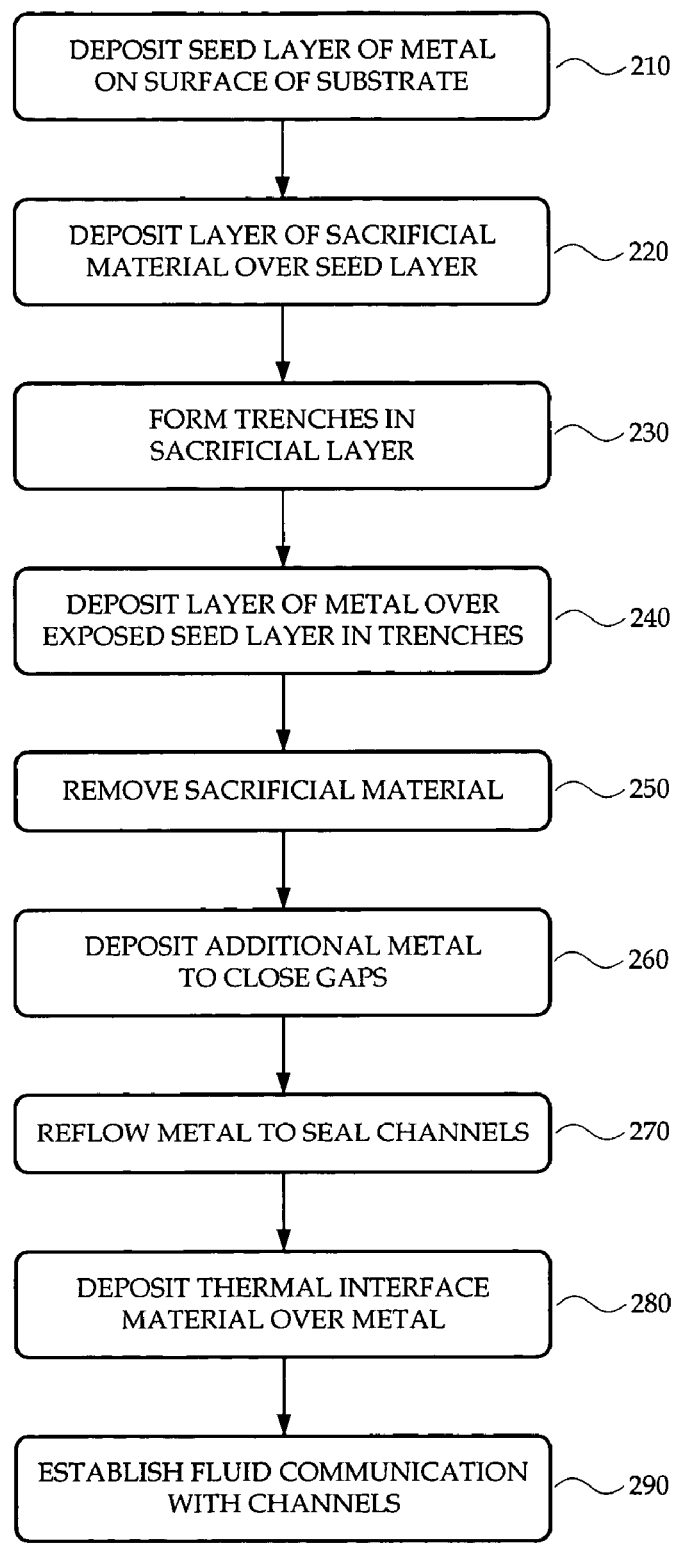
FIG. 2 is a block diagram illustrating an embodiment of a method of forming channels on a die or other substrate.

Illustrated in FIG. 2 are embodiments of a method for forming channels on a die, heat spreader, or other substrate. The method of FIG. 2 is further illustrated in the schematic diagrams provided in FIGS. 3A through 3H, and reference should be made to these figures as called out in the text below.

Figure 3A:
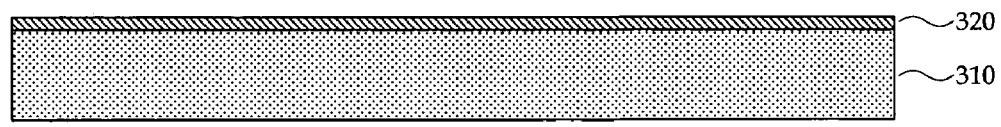
FIGS. 3A-3H are schematic diagrams further illustrating the method shown in FIG. 2.

Referring now to FIG. 2, a seed layer of a metal is deposited on a surface of a substrate, as set forth in block 210. This is illustrated in FIG. 3A, which shows a substrate 310, and a seed layer 320 of a metal has been formed over a surface of this substrate. As will be described in greater detail below, the metal seed layer provides a metal surface upon which additional layers of the metal may be deposited to form channels. In one embodiment, the metal seed layer comprises a thermally conductive metal and, in a further embodiment, the metal seed layer comprises copper or an alloy of copper. However, the metal may comprise any suitable thermally conductive metal (e.g., nickel) or other thermally conductive material (including non-metals). In a further embodiment, the seed layer is also electrically conductive (e.g., to facilitate electroplating). Any suitable blanket deposition process may be used to deposit the seed layer of metal, such as physical vapor deposition (PVD), chemical vapor deposition (CVD), etc.

In a further embodiment, prior to deposition of the seed layer, an adhesive layer may be deposited over the substrate surface, and this adhesive layer (not shown in figures) would promote adhesion between the seed layer and the substrate. Examples of materials that may be suitable for the adhesive layer include Ta, TaN, Ti, TiSi, TiSiN, and Ru, as well as combinations of these materials. Any suitable deposition technique (e.g., PVD, CVD, etc.) may be used to apply the adhesive layer.

In one embodiment, the substrate comprises an integrated circuit (IC) die. For an IC die employing a C4 technique for making electrical connections with a next-level component—e.g., a ball-grid array (BGA) connection scheme—one surface of the die will include an array of bond pads to be used for establishing electrical connections, and the seed layer may be deposited over an opposing side of the die. As the reader will appreciate, during the manufacture of IC devices, a number of separate die are typically formed on a wafer, and the disclosed embodiments may be practiced on a number of die that comprise a wafer prior to singulation of the die. Thus, in another embodiment, the substrate comprises a wafer upon which a number of IC die are being (or have been) formed. The wafer may comprise any suitable material—e.g., silicon, silicon-on-insulator (SOI), GaAs, etc. In a further embodiment, the substrate comprises a heat spreader. This heat spreader may, in one embodiment, be adapted for coupling with an IC die. It should, however, be understood that an IC die and heat spreader are but a few examples of the types of components upon which the disclosed embodiments may find application, and these examples are presented without limitation.

Figure 3B:
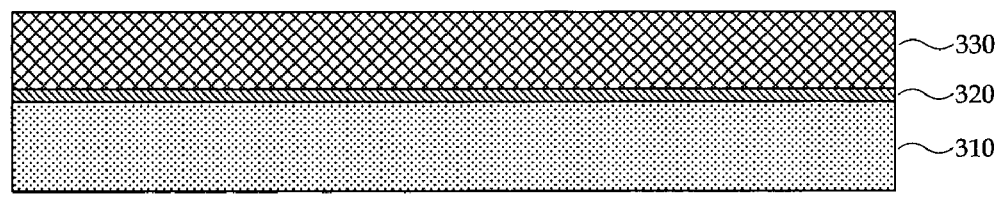

Referring to block 220 in FIG. 2, a layer of a sacrificial material is deposited over the seed layer. This is illustrated in FIG. 3B, where a layer of sacrificial material 330 has been formed over the metal seed layer 320. As suggested above, additional metal will be deposited over the metal seed layer, and this metal will form a structure defining a number of channels, and the sacrificial material will be subsequently removed during formation of these channels, as will be described below. The sacrificial material may comprise any material that can be readily removed without removal of the metal or, alternatively, that can be removed at a much faster rate than the removal rate of the metal. In one embodiment, the sacrificial material comprises a dielectric material or other insulating material. In another embodiment, the sacrificial material comprises a photoresist material. Examples of sacrificial materials include silicon dioxide ($SiO_2$) and other oxide materials, as well as nitride materials (e.g., $Si_3N_4$, AlN, etc.). Any suitable blanket deposition process (e.g., PVD, CVD, etc.) may be used to deposit the sacrificial material layer 330.

Figure 3C:
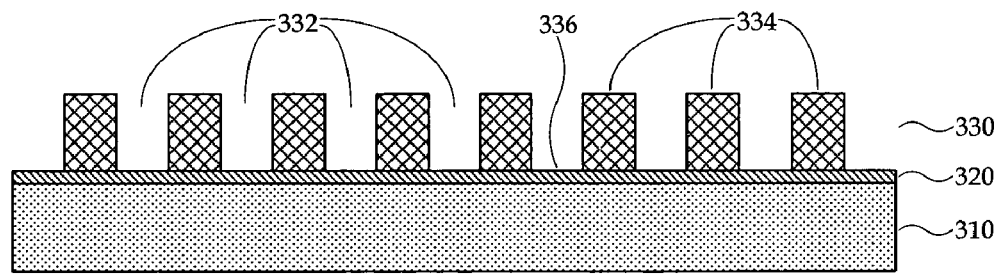

Trenches are then formed in the sacrificial layer, as set forth in block 230. This is illustrated in FIG. 3C, which shows a number of trenches 332 that have been formed in the sacrificial material layer 330, wherein portions 334 of the sacrificial material layer remain. The trenches 332 are formed down to the underlying metal seed layer 320, such that the metal seed layer 320 is exposed at the bottom 336 of each trench 332. Any suitable photolithography and etching techniques may be employed to create the trenches 332. The trenches 332 will be filled with a metal material and the remaining portions 334 of the sacrificial layer 330 ultimately removed to form the channels, as will be described in more detail below.

Figure 3D:
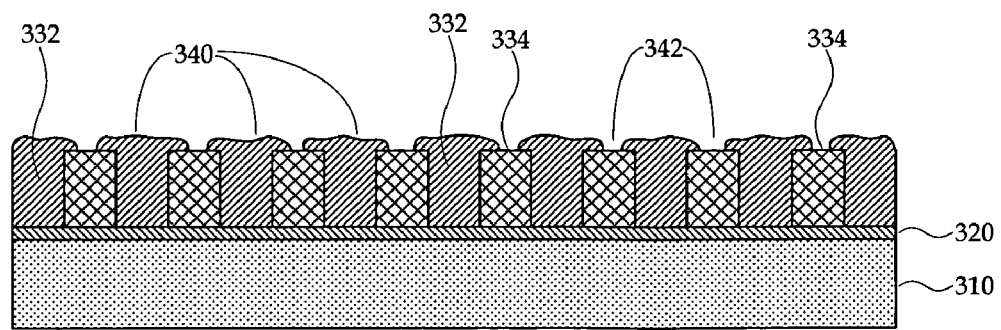

Referring next to block 240, a layer of metal is then deposited over the exposed seed layer within the trenches. This is illustrated in FIG. 3D, where a layer of metal 340 has been deposited over the exposed seed layer 320 within each of the trenches 332. Note that the metal layer 340 within each trench 332 substantially fills the trench and extends over the upper edges of the trench and onto an upper surface of the sacrificial material layer 330. However, gaps 342 remain between the metal material extending from adjacent metal-filled trenches, and these gaps 342 expose the underlying sacrificial material (which is to be subsequently removed).

The metal layer 340 will generally comprise the same metal as that of the seed layer 320 (however, it is within the scope of the disclosed embodiments that the metal layer 340 comprise a metal different than that of the seed layer 320). In one embodiment, the metal layer (and seed layer) comprises copper or an alloy of copper. However, the metal layer (and seed layer) may comprise any suitable thermally conductive metal (e.g., nickel) or other thermally conductive material (including non-metals). Also, in a further embodiment, the metal layer comprises an electrically conductive material (e.g., to facilitate electroplating). In one embodiment, the metal 340 is selectively deposited on the exposed seed layer 320 using an electroplating process. In another embodiment, the metal 340 is selectively deposited on the exposed seed layer 320 using an electroless plating process. For either the electroplating or electroless plating processes, any suitable plating solution and/or process parameters may be employed.

Figure 3E:
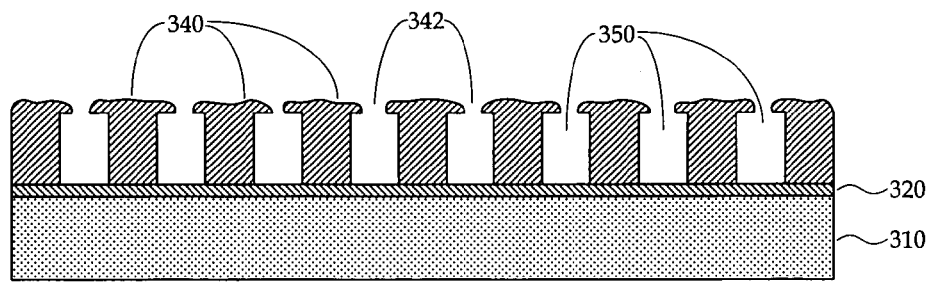

The remaining portions of the sacrificial material are then removed, as set forth in block 250. This is illustrated in FIG. 3E, where the remaining sacrificial material has been removed, forming open channels 350 between sidewalls formed from the metal material 340 (e.g., the metal material deposited in the trenches of the sacrificial material). Note that the gaps 342 existing between adjacent portions of the metal material 340 still remain. The sacrificial material may be removed using any process which removes the sacrificial material without removing the metal material 340 (or underlying seed layer 320), or using any process which removes the sacrificial material at a much greater rate than the removal rate of the metal material 340. In one embodiment, the sacrificial material is removed using a selective chemical etch process. In another embodiment, the sacrificial material is removed using a thermal decomposition process. In a further embodiment, the sacrificial material is removed using a combination of selective etching and thermal decomposition.

Figure 3F:
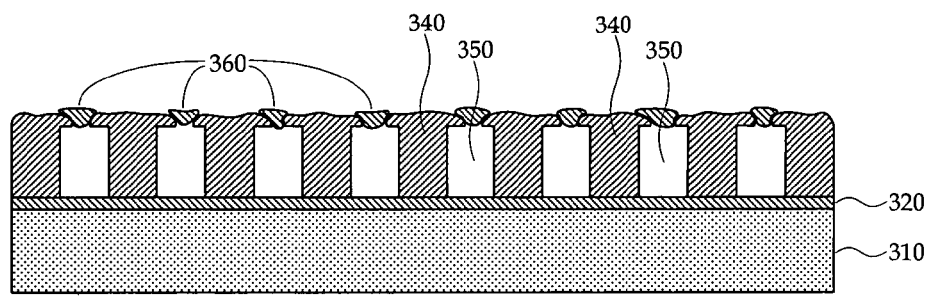

With reference now to block 260, additional metal is deposited over the existing metal to close the gaps. This is illustrated in FIG. 3F, where additional metal 360 has been deposited over the existing metal 340 to close the gaps 342, thereby closing the channels 350. However, the channels 350 will still be accessible (e.g., at their ends) to allow for the inlet (and outlet) of fluid into the channels (examples of liquid cooling systems employing such channels will be described below with respect to FIGS. 4A-4C and 5A-5B). Generally, the additional metal 360 will comprise the same metal as the underlying metal 340 (e.g., copper or an alloy thereof). Any suitable process may be employed to deposit the additional metal (e.g., electroplating or electroless plating).

Figure 3G:
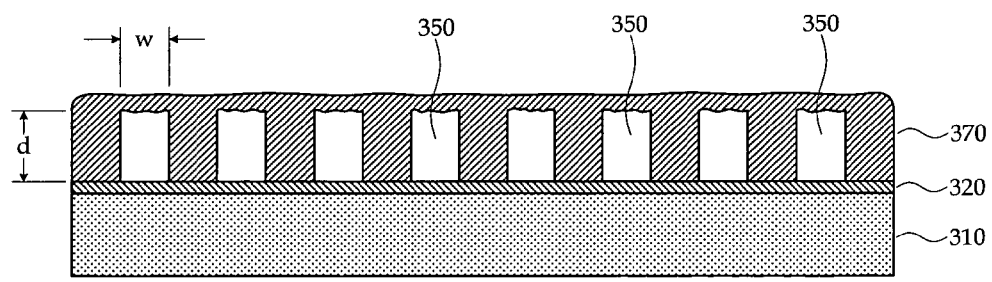

As set forth at block 270, the metal is then reflowed to seal off the channels. This is illustrated in FIG. 3G, where the metal (e.g., additional metal 360 and underlying metal 340) has been reflowed to form a metal layer 370 through which the now sealed channels 350 extend. Again, although the reflow process forms a seal (by reflowing the metal 340, 360 over gaps 342), it should be understood that the channels 350 are still accessible for fluid flow, as previously noted. Any suitable process may be employed to reflow the metal. In one embodiment, the metal 340, 360 is reflowed at a temperature between 200° C. and 400° C. (e.g., as for copper).

Figure 3H:
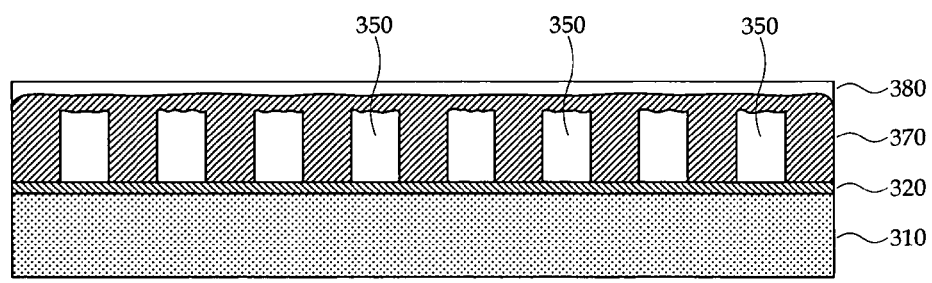

In a further embodiment, which is illustrated in block 280, a thermal interface material is deposited over the metal layer. This is illustrated in FIG. 3H, which shows a layer of thermal interface material 380 that has been deposited over the metal layer 370. The thermal interface layer 380 may be used to couple the substrate 310 to another component, such as a passive thermal dissipation device. For example, where the substrate 310 comprises a die, the thermal interface layer 380 may be used to couple the die (and metal layer 370 having channels 350) to a heat spreader and/or a heat sink. By way of further example, where the substrate 310 comprises a heat spreader, the thermal interface layer 380 may be used to couple the heat spreader with a die and/or a heat sink. The thermal interface layer 380 may comprise any suitable thermally conductive metal or other thermally conductive material (including non-metals), such as solder, nickel, copper, a thermal grease, a thermally conductive epoxy, etc. Any suitable deposition technique may be employed to apply the thermal interface layer 380.

In yet another embodiment, which is illustrated in block 290, fluid communication is established with the channels. For example, the channels 350 may form part of a liquid cooling system, wherein a fluid is pumped through the channels 350 to cool the substrate 310. Various embodiments of a die cooling system utilizing the disclosed channels (such as those shown and described above with respect to FIG. 2 and FIGS. 3A-3H) are illustrated in FIGS. 4A-4C and 5A-5B, which are described below.

The channels 350 may have any suitable dimensions. In one embodiment, the channels 350 have a depth (d)—and the sacrificial material layer a thickness—of between 10 μm and 500 μm. In a further embodiment, the channels 350 have a depth (d) of approximately 50 μm. In one embodiment, the channels 350 have a width (w) of between 5 μm and 50 μm (see FIG. 3G). Also, the formation of a relatively small number of channels 350 is depicted in FIGS. 3A-3H for ease of illustration; however, it should be understood that any suitable number of channels may be formed according to the disclosed embodiments. Further, it should be understood that channels formed according to the disclosed embodiments may be arranged in any suitable pattern.

In yet another embodiment, the substrate 310 may be thinned prior to formation of the channels 350. Thinning of the substrate 310 can decrease the thermal resistance between integrated circuitry formed on a front side of the substrate and the channels 350, which may be formed on an opposing backside of the substrate. Any suitable technique may be employed to thin the substrate 310, such as lapping, grinding, chemical-mechanical polishing (CMP), etc. Also, where the substrate 310 comprises a heat spreader, the die to which the heat spreader is attached may be thinned in a similar fashion.

Figure 4A:
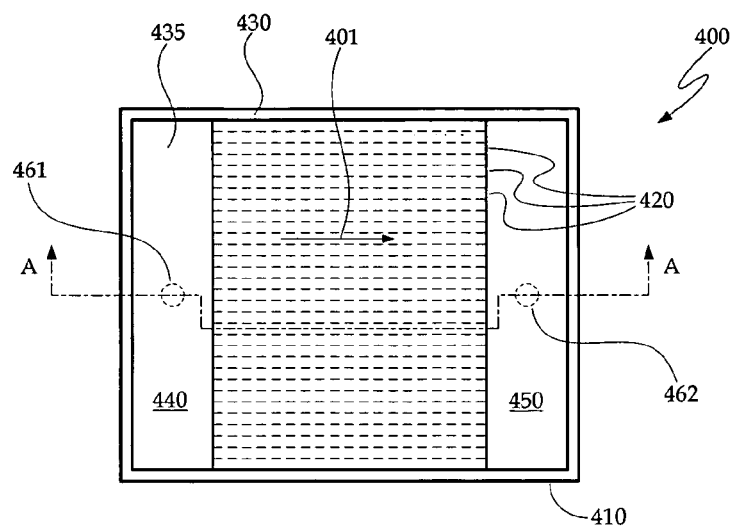
FIG. 4A is a schematic diagram illustrating a plan view of an IC device including an embodiment of a cooling system.
Figure 4B:
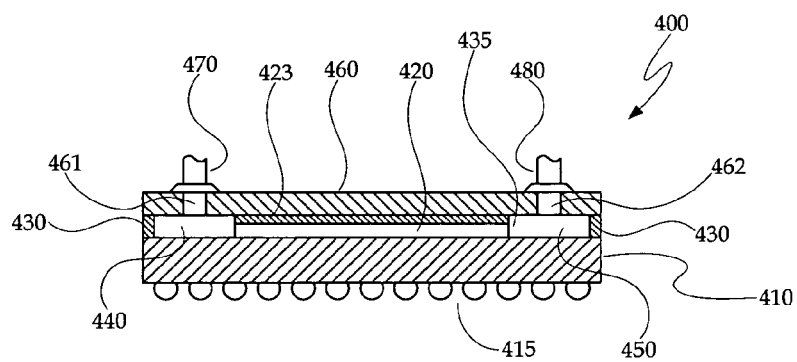
FIG. 4B is a schematic diagram illustrating a cross-sectional elevation view of the IC device of FIG. 4A.

Turning now to FIGS. 4A and 4B, illustrated is an embodiment of an IC device 400 having a liquid cooling system including a number of channels, and these channels may be formed according to the disclosed embodiments. A plan view of the IC device 400 is shown in FIG. 4A, and a cross-sectional elevation view of the IC device 400, as taken along line A-A of FIG. 4A, is shown in FIG. 4B.

The IC device 400 includes a die 410 having a plurality of leads 415 (e.g., an array of solder bumps, each extending from a bond pad on die 410) formed on one side of the die. The die 410 may comprise any type of integrated circuit device, such as a microprocessor, network processor, or other processing device. Disposed on an opposing side if the die 410 is a number of channels 420. In one embodiment, the channels 420 are formed according to the embodiments disclosed above with respect to FIGS. 2 and 3A-3H and the accompanying text. Channels 420 may, in one embodiment, be formed from copper or an alloy of copper.

Also disposed on the opposing side of the die 410 is a barrier 430. In one embodiment, the barrier comprises a wall extending about a periphery of the die, the wall having a height substantially the same as a height of the structure within which the channels 420 are formed. The barrier 430 may, in one embodiment, be formed in conjunction with formation of channels 420 and, in another embodiment, the barrier 430 comprises the same material as that used to construct channels 420 (e.g., copper).

The barrier 430 defines an interior region 435 that extends over the opposing side of die 410 and encompasses the channels 420. Also contained within the interior region 435 and defined, at least in part, by barrier 430 is an inlet fluid reservoir 440 and an outlet fluid reservoir 450. The inlet fluid reservoir 440 is in fluid communication with at least some of the channels 420, and the outlet fluid reservoir 450 is also in fluid communication with at least some of the channels 420.

A cover plate 460 is then coupled with the die 410, as shown in FIG. 4B. Note that, for ease of illustration, the IC device 400 is shown with the cover plate 460 removed in FIG. 4A. The cover plate 460 includes a first aperture 461 in fluid communication with the inlet reservoir 440 and a second aperture 462 in fluid communication with the outlet reservoir 450 (the locations of the apertures 461, 462 are shown in dashed line in FIG. 4A). Cover plate 460 may be constructed from any suitable material and, in one embodiment, the cover plate 460 is comprised of a thermally conductive material (e.g., copper or an alloy thereof).

The cover plate 460 may be attached to the barrier 430 and, in a further embodiment, the cover plate 460 is also attached to the structure of channels 420 (e.g., to an upper surface 423 of the channel structure). A fluid seal may be formed between the barrier 420 and cover plate 460 to prevent liquid coolant from leaking onto the die 410 (or other surrounding components). Also, a fluid seal may be provided between the upper surface 423 of the channel structure and the cover plate 460, such that coolant cannot leak between the inlet and outlet reservoirs 440, 450, thereby bypassing the channels 420.

As shown in FIG. 4B, a first fluidic connection 470 is formed with the first aperture 461 in cover plate 460 and, similarly, a second fluidic connection 480 is formed with the second aperture 462 in the cover plate 460. In one embodiment, each of the first and second fluidic connections 470, 480 comprises a piece of tubing attached to their respective aperture in cover plate 460 using any one of a swaging technique, a bonding process (e.g., epoxy bonding), or tapped fittings. Through the first fluidic connection 470 and first aperture 461, a liquid coolant can be introduced into the inlet reservoir 440 under a pressure sufficient to cause the liquid to flow into the channels 420 and towards outlet reservoir 450 (see arrow 401). Sufficient fluid pressure may be provided by a pump (not shown in figures). As the liquid coolant flows through the channels 420 and into the outlet reservoir 450, the coolant will extract heat from the die 410. Coolant flowing into the outlet reservoir 450 can then be drawn out through the second aperture 462 and second fluidic connection 480. Examples of liquid coolants include: a mixture of water and a corrosion inhibitor, a mixture of water and ethylene glycol, a mixture of water and propylene glycol, an alcohol (e.g., ethanol), and a light weight oil. Also, either single-phase cooling (e.g., where the coolant remains a liquid) or two-phase cooling (e.g., where a portion of a liquid coolant is vaporized to create a liquid-vapor mixture) may be employed.

Figure 4C:
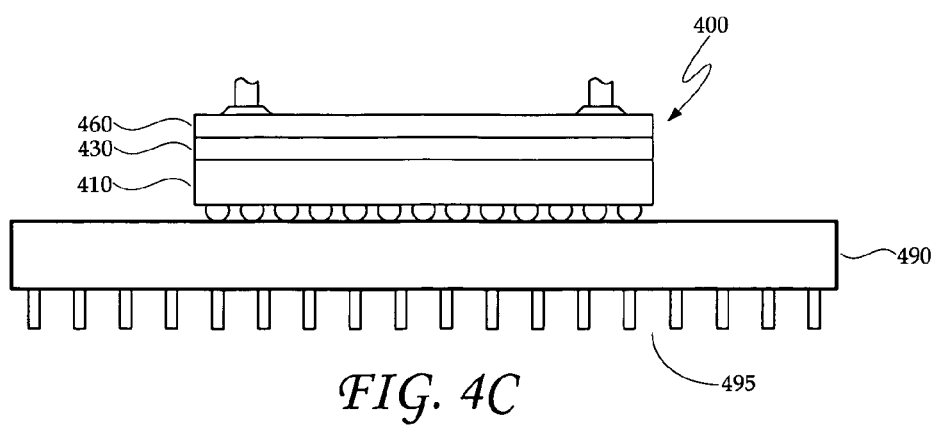
FIG. 4C is a schematic diagram illustrating an elevation view of a further embodiment of the IC device of FIG. 4A.

Referring to FIG. 4C, in a further embodiment, the IC device 400 is coupled with a package substrate 490. The die leads 415 are coupled with a mating array of terminals on the package substrate 490. Package substrate 490 may include an array of leads 495 (e.g., a ball grid array or a pin grid array, as shown) to couple the package assembly with a next-level component, such as a motherboard, a computer system, a circuit board, another IC device, etc.

Figure 5A:
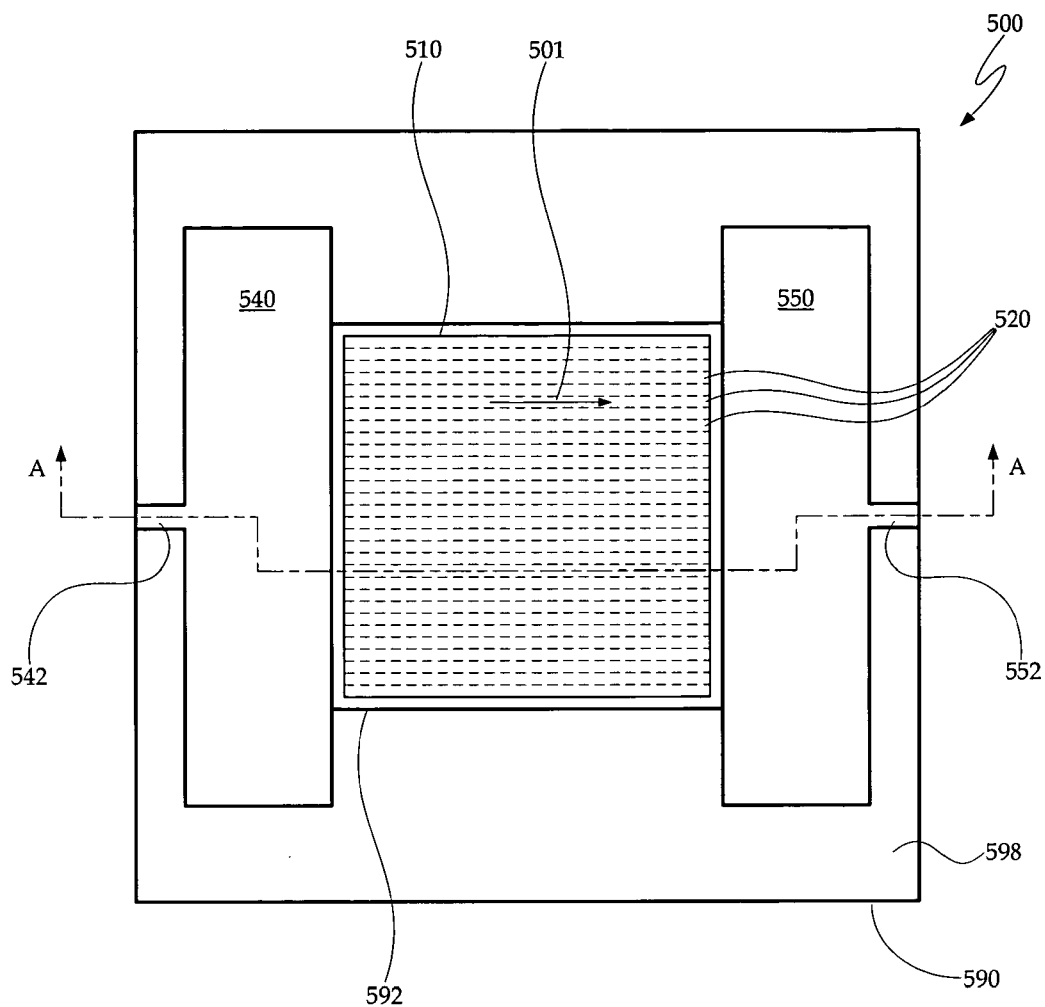
FIG. 5A is a schematic diagram illustrating a plan view of an IC device including another embodiment of a cooling system.
Figure 5B:
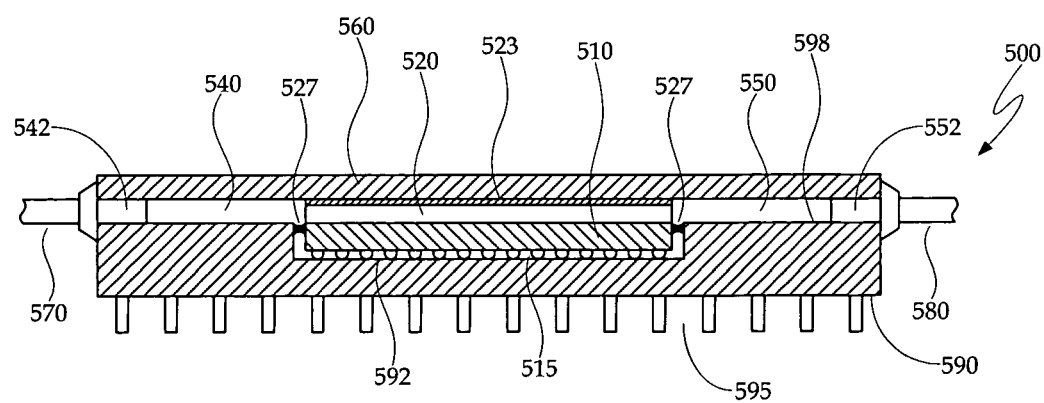
FIG. 5B is a schematic diagram illustrating a cross-sectional elevation view of the IC device of FIG. 5A.

Turning next to FIGS. 5A and 5B, illustrated in another embodiment of an IC device 500 having a liquid cooling system including a number of channels, which channels may be formed according to the disclosed embodiments. A plan view of the IC device 500 is shown in FIG. 5B, and a cross-sectional elevation view of the IC device 500, as taken along line A-A of FIG. 5A, is shown in FIG. 5B.

The IC device 500 includes a die 510 having a plurality of leads 515 (e.g., an array of solder bumps, each extending from a bond pad on die 510) formed on one side of the die. Die 510 may comprise any type of integrated circuit device, such as a microprocessor, network processor, or other processing device. Disposed on an opposing side of the die 510 is a number of channels 520. In one embodiment, the channels 520 are formed according to the embodiments disclosed above with respect to FIGS. 2 and 3A-3H and the accompanying text. The channels 520 may, in one embodiment, be formed from copper or an alloy of copper.

The IC device 500 includes a substrate 590. In one embodiment, the substrate 590 comprises a number of layers of metallization, each layer of metallization separated from adjacent layers by a layer of dielectric material. Formed on an upper surface 598 of the substrate 590 is a die recess 592 that is sized and shaped to receive die 510. Die 510 is disposed in the die recess 592, and the die leads 515 are coupled with corresponding lands on the substrate 590. Signal traces formed within the metallization layers of the substrate 590 route the die leads to an array of leads 595 (e.g., a ball grid array or a pin grid array, as shown) formed on an opposing lower surface of the substrate 590. The substrate leads 595 couple the IC device 500 with a next-level component, such as a motherboard, a computer system, a circuit board, another IC device, etc.

Also formed in the upper surface 598 of substrate 590 is an inlet fluid reservoir 540 and an outlet fluid reservoir 550. The die recess 592 is formed to a depth greater than a depth of the inlet and outlet fluid reservoirs 540, 550, such that the channels 520 extending across die 510 are at approximately the same elevation as the inlet and outlet reservoirs 540, 550, respectively. The inlet reservoir 540 is in fluid communication with at least some of the channels 520, and the outlet reservoir 550 is also in fluid communication with at least some of the channels 520. Inlet reservoir 540 includes an inlet port 542 and, similarly, outlet reservoir 550 includes an outlet port 552, both formed in substrate 590.

A cover plate 560 is then coupled with the substrate 590, as shown in FIG. 5B. Note that, for ease of illustration, the IC device 500 is shown with the cover plate 560 removed in FIG. 5A. In one embodiment, the die recess 592 in substrate 590 has a depth such that an upper surface 523 of the channel structure on die 510 is at substantially the same elevation as the upper surface 598 of the substrate. In this embodiment, the cover plate 560 is also coupled with the upper surface 523 of the channel structure on die 510. The cover plate 560 may be constructed from any suitable material. In one embodiment, the cover plate 560 is comprised of a plastic material, and in another embodiment, the cover plate comprises a metal material (e.g., copper or an alloy thereof). Cover plate 560 may be attached to the substrate 590 and die 520 using an epoxy bonding process, wherein the epoxy bond provides a fluid seal between the cover plate 560 and the upper surface 598 of substrate 590 and between the cover plate 560 and upper surface 523 of the channel structure on die 510. Alternatively, the cover plate may be mechanically attached to the substrate (e.g., as by mechanical fasteners), wherein a sealing compound (e.g., a silicone material) disposed between the cover plate 560 and the substrate 590 and the channel structure on die 510 provides a fluid seal.

The fluid seal provided between the cover plate 560 and the substrate 590 will prevent fluid leakage out of the IC package 500 (and on to other surrounding components), whereas the fluid seal between the cover plate 560 and upper surface 523 of the channel structure on die 510 will prevent fluid leakage between the inlet and outlet reservoirs 540, 550, such leakage potentially causing fluid to bypass the channels 520 on die 510. In addition, a sealing element 527 may be disposed between the die 510 and the substrate 590 (see FIG. 5B), and this sealing element 527 will prevent fluid leakage to locations within die recess 592 and underneath the die 510.

As shown in FIG. 5B, a first fluidic connection 570 is formed with the inlet port 542 and, similarly, a second fluidic connection 580 is formed with the outlet port 552. In one embodiment, each of the first and second fluidic connections 570, 580 comprises a piece of tubing attached to their respective port using any one of a swaging technique, a bonding process (e.g., epoxy bonding), or tapped fittings. Through the first fluidic connection 570 and inlet port 542, a liquid coolant can be introduced into the inlet reservoir 540 under a pressure sufficient to cause the liquid to flow into the channels 520 and towards outlet reservoir 550 (see arrow 501). Sufficient fluid pressure may be provided by a pump (not shown in figures). As the liquid coolant flows through the channels 520 and into the outlet reservoir 550, the coolant will extract heat from the die 510. Coolant flowing into the outlet reservoir 550 can then be drawn out through the outlet port 552 and second fluidic connection 580. As noted above, examples of liquid coolants include: a mixture of water and a corrosion inhibitor, a mixture of water and ethylene glycol, a mixture of water and propylene glycol, an alcohol (e.g., ethanol), and a light weight oil. Also, as previously noted, either single-phase or two-phase cooling may be employed.

In each of FIGS. 4A-4B and 5A-5B, the channels were formed on the die in a pattern comprising a number of channels extending longitudinally across the die from one edge to an opposing edge of the die. However, it should be understood that the disclosed embodiments are not limited to these patterns and, further, that a number of channels may be formed having any desired pattern. Additional examples of channel patterns are shown in each of FIGS. 6 and 7.

Figure 6:
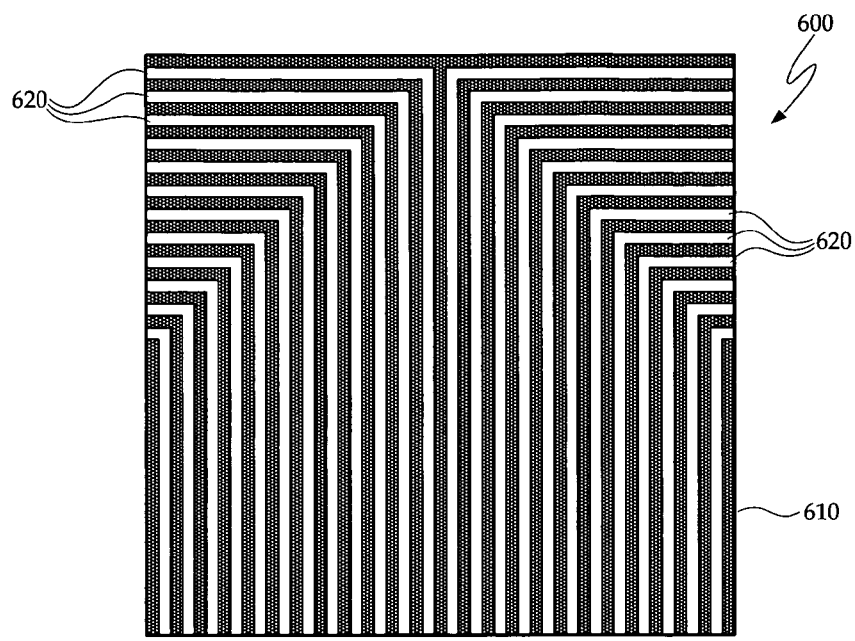
FIG. 6 is a schematic diagram illustrating another embodiment of a pattern of channels formed according to the disclosed embodiments.
Figure 7:
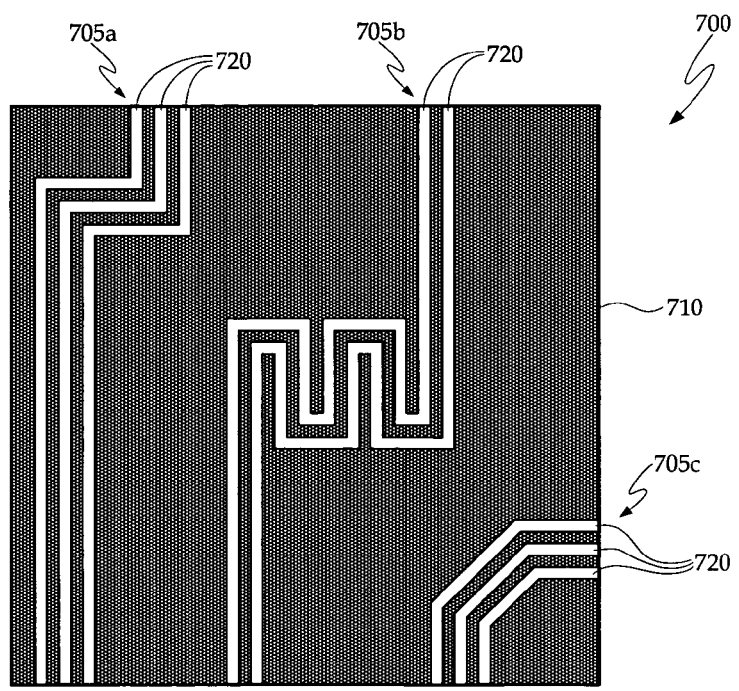
FIG. 7 is a schematic diagram illustrating a further embodiment of a pattern of channels formed according to the disclosed embodiments.

Referring first to FIG. 6, an IC device 600 includes a die 610 having a number of channels 620 formed over a surface of the die. Each of the channels 620 comprises both a longitudinally extending segment and a transversely extending segment and, further, each channel extends between one edge and an adjacent, perpendicular edge. Referring to FIG. 7, an IC device 700 includes a die 710 having a number of channels 720 formed over a surface of the die. Each of the channels 720 of FIG. 7 again comprises both a longitudinally extending segment and a transversely extending segment, and at least some of the channels 720 include a segment oriented at an angle relative to the longitudinal and transverse segments. For the embodiment of FIG. 7, however, the channels 720 are arranged in spaced-apart groups 705a, 705b, 705c, and such a pattern may be useful where it is desired to cool specific hot spots on the die 710. Of course, it should be understood that FIGS. 6 and 7 are but a few additional examples of the arrangement of channels on an IC die, and these examples are presented without limitation.

Figure 8:
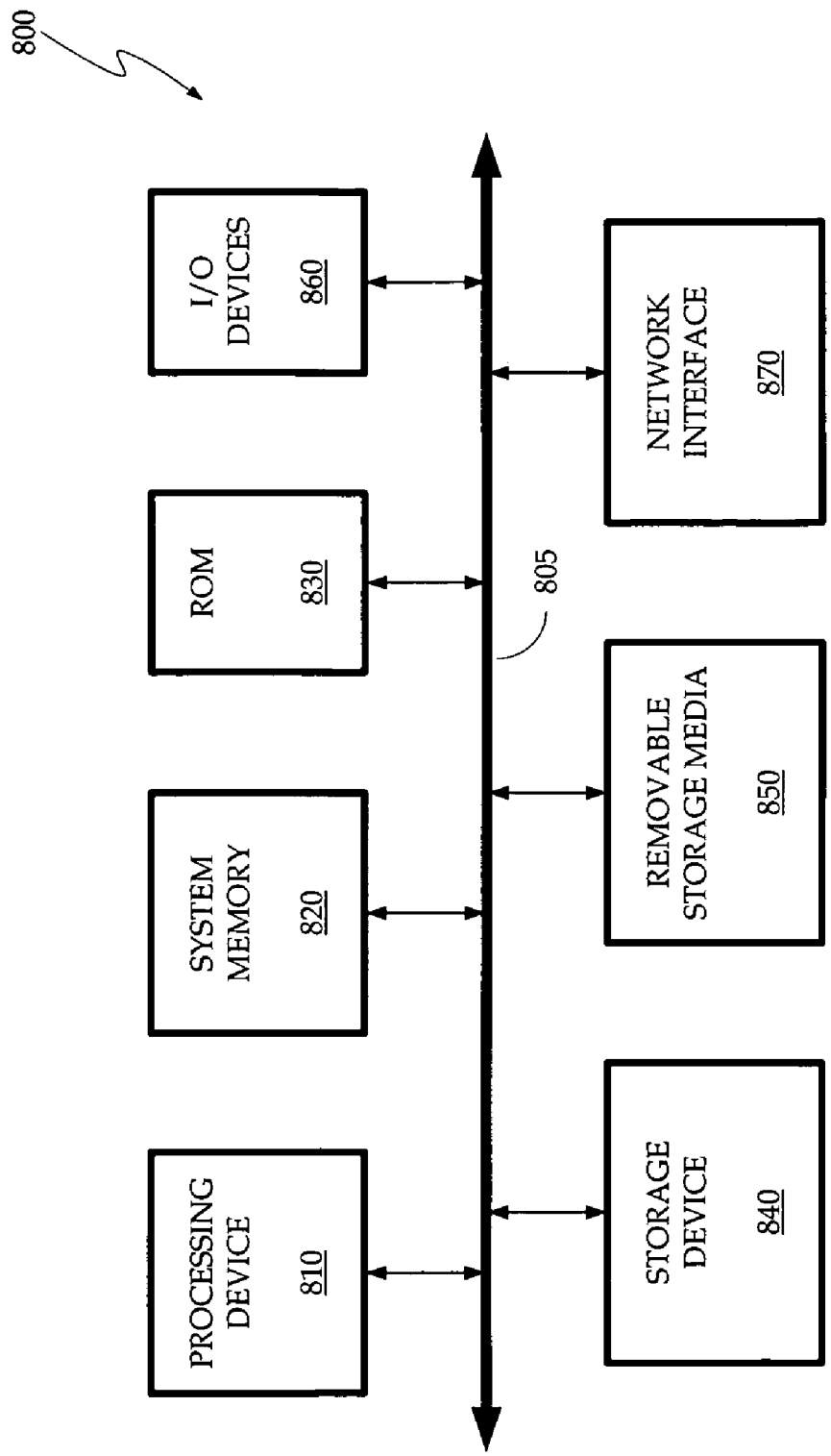
FIG. 8 is a schematic diagram illustrating an embodiment of a computer system, which may include a component having channels formed according to the disclosed embodiments.

Referring to FIG. 8, illustrated is an embodiment of a computer system 800. Computer system 800 includes a bus 805 to which various components are coupled. Bus 805 is intended to represent a collection of one or more buses— e.g., a system bus, a Peripheral Component Interface (PCI) bus, a Small Computer System Interface (SCSI) bus, etc.— that interconnect the components of system 800. Representation of these buses as a single bus 805 is provided for ease of understanding, and it should be understood that the system 800 is not so limited. Those of ordinary skill in the art will appreciate that the computer system 800 may have any suitable bus architecture and may include any number and combination of buses.

Coupled with bus 805 is a processing device (or devices) 810. The processing device 810 may comprise any suitable processing device or system, including a microprocessor, a network processor, an application specific integrated circuit (ASIC), or a field programmable gate array (FPGA), or similar device. It should be understood that, although FIG. 8 shows a single processing device 810, the computer system 800 may include two or more processing devices.

Computer system 800 also includes system memory 820 coupled with bus 805, the system memory 810 comprising, for example, any suitable type and number of memories, such as static random access memory (SRAM), dynamic random access memory (DRAM), synchronous DRAM (SDRAM), or double data rate DRAM (DDRDRAM). During operation of computer system 800, an operating system and other applications may be resident in the system memory 820.

The computer system 800 may further include a read-only memory (ROM) 830 coupled with the bus 805. During operation, the ROM 830 may store temporary instructions and variables for processing device 810. The system 800 may also include a storage device (or devices) 840 coupled with the bus 805. The storage device 840 comprises any suitable non-volatile memory, such as, for example, a hard disk drive. The operating system and other programs may be stored in the storage device 840. Further, a device 850 for accessing removable storage media (e.g., a floppy disk drive or a CD ROM drive) may be coupled with bus 805.

The computer system 800 may also include one or more I/O (Input/Output) devices 860 coupled with the bus 805. Common input devices include keyboards, pointing devices such as a mouse, as well as other data entry devices, whereas common output devices include video displays, printing devices, and audio output devices. It will be appreciated that these are but a few examples of the types of I/O devices that may be coupled with the computer system 800.

The computer system 800 further comprises a network interface 870 coupled with bus 805. The network interface 870 comprises any suitable hardware, software, or combination of hardware and software that is capable of coupling the system 800 with a network (e.g., a network interface card). The network interface 870 may establish a link with the network (or networks) over any suitable medium—e.g., wireless, copper wire, fiber optic, or a combination thereof—supporting the exchange of information via any suitable protocol—e.g., TCP/IP (Transmission Control Protocol/Internet Protocol), HTTP (Hyper-Text Transmission Protocol), as well as others.

It should be understood that the computer system 800 illustrated in FIG. 8 is intended to represent an exemplary embodiment of such a system and, further, that this system may include many additional components, which have been omitted for clarity and ease of understanding. By way of example, the system 800 may include a DMA (direct memory access) controller, a chip set associated with the processing device 810, additional memory (e.g., a cache memory), as well as additional signal lines and buses. Also, it should be understood that the computer system 800 may not include all of the components shown in FIG. 8.

In one embodiment, the computer system 500 includes a component having channels formed according to the disclosed embodiments, and in a further embodiment, the component includes a cooling system that utilizes the channels. For example, the processing device 510 of system 500 may be embodied as the IC device 400 of FIGS. 4A-4C or as the IC device 500 of FIGS. 5A-5B. However, it should be understood that other components of system 500 (e.g., network interface 570, etc.) may include a device having channels formed according to the disclosed embodiments.

Embodiments of a method 200 for forming channels in a die or other substrate, as well as embodiments of IC devices 400, 500 having cooling systems including such channels, having been described above, the reader will appreciate the advantages of the disclosed embodiments. Direct fabrication of the channels on a die (or other substrate) may result in a very low thermal contact resistance between the die and the channel structure. The process of forming the channels can be cost effective, as the channels are formed using an electroplating or electroless plating process and, further, because the channel forming process may require just a single mask step. Also, the disclosed embodiments allow for the formation of channels on a die without the need to perform micromachining of the die. Further, the disclosed embodiments may be compatible with a thin die. In addition, where the channel structure is formed from copper or another thermally conductive material, the channel structure can also function as a heat spreader.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising:

forming a number of channels over a surface of an integrated circuit die;

forming a barrier on the die surface, the barrier extending about a periphery of the die and defining an interior region including the channels;

forming an inlet reservoir within the interior region of the barrier, the inlet reservoir in fluid communication with at least some of the channels; and forming an outlet reservoir within the interior region of the barrier, the outlet reservoir in fluid communication with at least some of the channels, wherein forming the number of channels comprises:

depositing a seed layer of a metal over the die surface;

depositing a layer of a sacrificial material over the seed layer;

forming a number of trenches in the sacrificial layer, wherein the seed layer is exposed in each of the trenches;

depositing a layer of the metal over the exposed seed layer in the trenches, the metal layer extending over portions of an upper surface of the sacrificial layer, wherein gaps remain between the metal material extending from adjacent trenches and over the upper surface of the sacrificial layer;

removing the sacrificial layer, wherein regions from which the sacrificial layer has been removed form the channels in the metal layer; and depositing an additional layer of the metal over upper surfaces of the metal layer to close the gaps over the channels.

2. The method of claim 1, further comprising coupling a cover plate with the die, the cover plate extending over the barrier and the interior region, the cover plate including a first aperture in fluid communication with the inlet reservoir and a second aperture in fluid communication with the outlet reservoir.

3. The method of claim 2, wherein the cover plate comprises a heat spreader.

4. The method of claim 2, further comprising:

making a first fluidic connection with the first aperture and the inlet reservoir; and making a second fluid connection with the second aperture and the outlet reservoir.

5. The method of claim 1, further comprising reflowing the metal to seal each of the channels.

6. The method of claim 5, further comprising depositing a thermal interface material over the metal material.

7. The method of claim 1, wherein the metal comprises copper.

8. The method of claim 7, wherein the barrier is formed from a material comprising copper.

* * * * *